(12) United States Patent
Moriwaki et al.

(10) Patent No.: US 6,515,844 B1
(45) Date of Patent: Feb. 4, 2003

(54) ELECTRONIC PART

(75) Inventors: Nobushige Moriwaki, Izumo (JP); Kazuhiro Yoshida, Shimane-ken (JP); Kenichi Watanabe, Izumo (JP); Akio Shobu, Ooda (JP); Mitsuru Nagashima, Shimae-ken (JP); Yukio Tanaka, Izumo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/296,896

(22) Filed: Apr. 22, 1999

(30) Foreign Application Priority Data

May 28, 1998 (JP) .......................... 10-166253
Aug. 27, 1998 (JP) .......................... 10-259291

(51) Int. Cl.⁷ ................................ H01G 4/00
(52) U.S. Cl. ................ 361/306.1; 361/306.3; 361/307; 361/301.4
(58) Field of Search ............. 361/301.1, 301.4, 361/306.1–306.3, 307, 308.1–308.3, 309, 310, 520, 538, 328–330; 429/178

(56) References Cited

U.S. PATENT DOCUMENTS

| 4,004,200 A | | 1/1977 | Johanson |
| 4,151,579 A | * | 4/1979 | Stark ........................ 361/308 |
| 4,346,429 A | * | 8/1982 | DeMatos .................. 361/310 |
| 4,581,479 A | | 4/1986 | Moore et al. |
| 4,635,026 A | * | 1/1987 | Takeuchi ............. 338/22 SD |
| 5,241,134 A | * | 8/1993 | Yoo ....................... 174/94 R |

FOREIGN PATENT DOCUMENTS

| JP | 6240818 | | 3/1987 | |
| JP | 4188810 | | 7/1992 | |
| JP | 8-130284 | * | 5/1996 | ....... H01L/23/50 |
| JP | 9008433 | | 1/1997 | |

* cited by examiner

Primary Examiner—Dean A. Reichard
Assistant Examiner—Eric Thomas
(74) Attorney, Agent, or Firm—Keating & Bennett, LLP (57) ABSTRACT

An electronic part in which an external terminal made of a metallic plate provided with at least one slit is on an electronic part element via a conductive joint member.

13 Claims, 5 Drawing Sheets

ELECTRONIC PART

BACKGROUND OF THE INVENTION

1. Field of the Invention

The present invention relates to an electronic part such as a capacitor, a varistor, or an inductor, and, more specifically, to an electronic part having a configuration provided with a metallic external terminal arranged to alleviate any stress caused by a substrate upon which the part is mounted.

2. Description of the Related Art

Some large size ceramic electronic parts such as a chip type multi-layer ceramic capacitor to be used for an application requiring a large capacity, have a configuration provided with an external terminal comprising a metallic plate used as the external terminal for alleviating the stress derived from the deflection of the substrate upon which the part is mounted.

Figure 9:
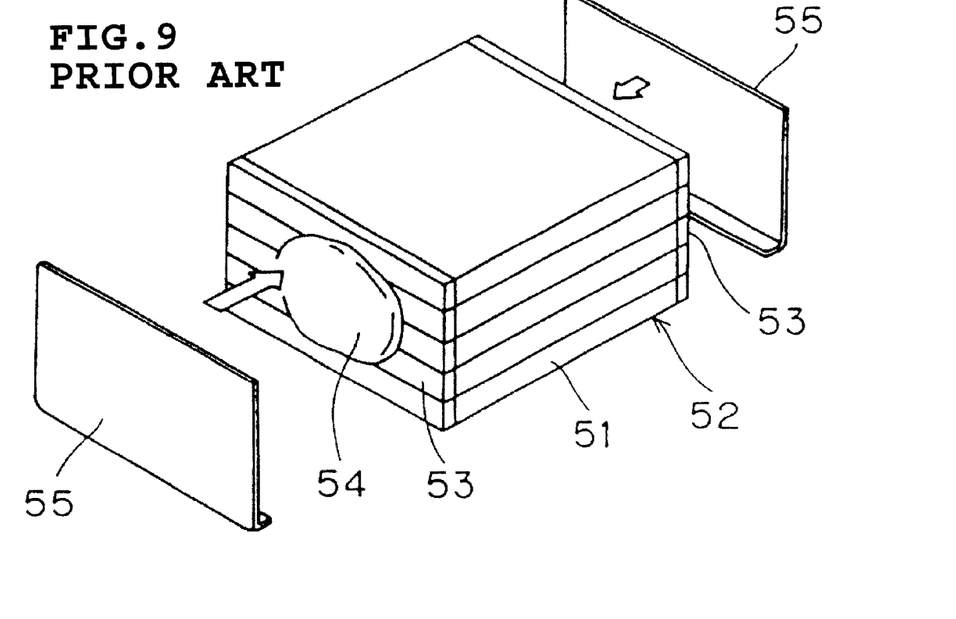
FIG. 9 is a perspective view showing an electronic part comprising a conventional external terminal.
Figure 10:
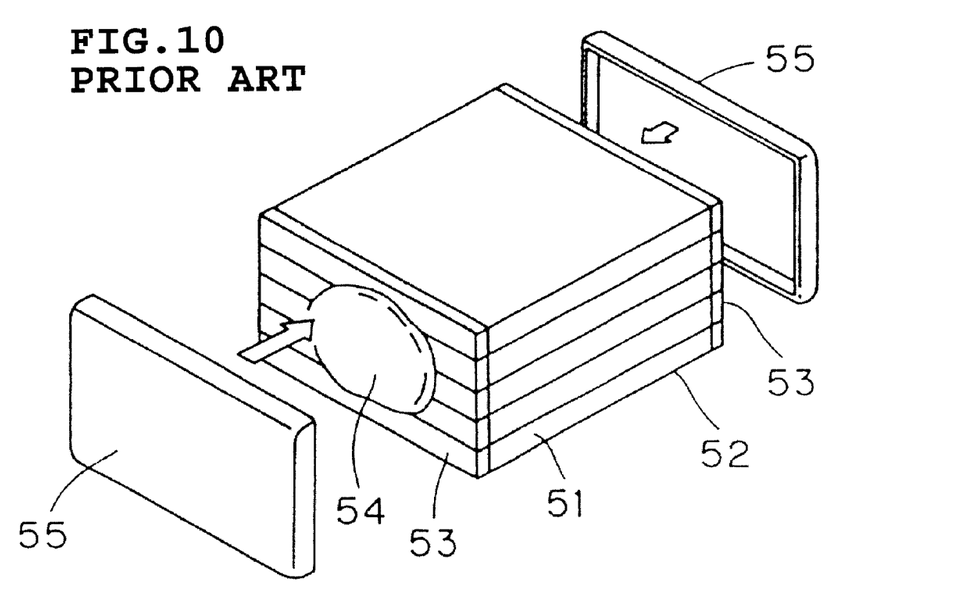
FIG. 10 is a perspective view showing another electronic part comprising a conventional external terminal.

For example, FIG. 9 and FIG. 10 show electronic parts (multi-layer ceramic capacitors) which are formed by installing an external terminal 55 in a multi-layer member 52 comprising a plurality of laminated multi-layer ceramic capacitor elements 51 provided with electrodes 53 at both end faces so as to connect with each terminal 55 via a jointing material 54 such as a solder and a conductive adhesive.

In the multi-layer ceramic capacitor of FIG. 9, an external terminal 55 having a flat plate-like shape with the lower end part bent around the lower surface side of the multi-layer member 52 is used. In the multi-layer ceramic capacitor of FIG. 10, a cap-like external terminal 55 having a flat plate-like shape with the peripheral part bent so as to fit into the end part of the element multi-layer member 52 is used.

However, in the above-mentioned electronic parts using an external terminal comprising a metallic plate, a problem is involved in that if a thermal impact is applied in mounting the part to a substrate, due to deflection of the substrate or the difference between the multi-layer ceramic capacitor element and the external terminal in terms of the coefficient of linear expansion, tensile stress is applied on the multi-layer ceramic capacitor element so as to facilitate generation of crack or peel-off.

SUMMARY OF THE INVENTION

The object of the present invention is to solve the above-mentioned problem, and to do so by providing a highly reliable electronic part capable of restraining or preventing generation of crack, split or peel-off in an electronic part element of which the electronic part is comprised by reducing the stress to be applied onto the electronic part element when thermal shock is applied.

In order to achieve the above-mentioned object, an electronic part according to a first aspect of the present invention comprises an electronic part element, and an external terminal made of a metallic plate provided with a slit attached to the electronic part element via a conductive jointing material.

In the present invention, a solder, a conductive adhesive, or the like, can be used as the conductive jointing material.

Moreover, in the present invention, since only a slit is formed in the external terminal and thus the contacting area of the external terminal and the electronic part element is almost the same as the case without forming the slit, it will not lead to an increase of the ESR (Equivalent Series Resistance).

Moreover, an electronic part according to a second aspect of the present invention comprises a multi-layer member with a plurality of laminated electronic part elements, and an external terminal made of a metallic plate provided with a slit, attached to the element multi-layer member via a conductive jointing material.

In an electronic part according to a third aspect of the present invention, the slit of the external terminal is formed in the direction substantially perpendicular to the mounting surface of the electronic part.

Moreover, in an electronic part according to a fourth aspect of the present invention, a plurality of slits are provided in the metallic plate comprising the external terminal.

By providing one or more of a plurality of slits as in the first, second or fourth aspects or a perpendicular slit as in the third aspect, the stress to be applied onto the electronic part element generated by the deflection of a substrate upon which the electronic is to be mounted or the difference between the external terminal and the electronic part element in terms of the coefficient of linear expansion when thermal shock is applied can be alleviated efficiently.

Moreover, in an electronic part according to a fifth aspect of the present invention, the slit is filled with a substance having a larger coefficient of linear expansion or a substance having a lower Young's modulus with respect to the material comprising the external terminal.

In the case of the fifth aspect, the stress to be applied onto the electronic part element can be reduced because the substance for filling the slit expands and contracts more dramatically than the external terminal. More particularly, the filling substance contracts more dramatically than the external terminal at a low temperature, and, accordingly, the deformation (expansion, contraction) of the external terminal is restrained, that is, the expansion and contraction of the external terminal itself are restrained owing to the influence from the expansion and the contraction of the filled substance, and consequently the stress to be applied onto the electronic part element is reduced. Moreover, when a substance having a lower Young's modulus with respect to the external terminal is provided for filling the slit, the stress on the electronic part itself becomes smaller.

In the electronic part according to the fifth aspect, it is preferable that the filing material is accommodated in the slit, but even if it overflows the slit slightly, it does not cast a great influence on the effect of restraining the stress to be applied onto the electronic part element.

The present inventors presumed that there is a risk of lowering the effect of absorbing or alleviating the stress if the slit formed in the external terminal is filled with the jointing material (such as a solder and a conductive adhesive) for jointing the external terminal with the electronic part element, however in reality, it was leaned that the stress to be applied onto the electronic part element can be reduced by filling with a substance having a larger coefficient of linear expansion or a substance having a lower Young's modulus with respect to the material comprising the external terminal.

As a substance having a larger coefficient of linear expansion or a substance having a lower Young's modulus with respect to the material comprising the external terminal for filling the slit, various substances can be used, but the stress to be applied onto the electronic part element can be restrained efficiently in accordance with a sixth aspect of the invention by using at least one selected from the group consisting of a resin, a solder and a conductive adhesive.

In an electronic part according to a seventh aspect, the substance for filling the slit is the substance which is the same as the jointing material used for jointing the external terminal with the electronic part element.

By using a substance which is the same as the jointing material used for jointing the external terminal with the electronic part element as the substance for filling the slit, the slit can be filled efficiently with a substance having a larger coefficient of linear expansion or a substance having a lower Young's modulus with respect to the material comprising the external terminal so that the present invention can further be effective while avoiding the complication of the production process.

As the jointing material used for jointing the external terminal and the electronic part element, a substance having conductivity, such as a solder and a conductive adhesive is mainly used, but a resin not having conductivity can also be used, aiming only at the mechanical connection but not the electrical conduction. Filling the slit of the external terminal with such a resin also corresponds to the embodiment of the seventh aspect.

Moreover, in an electronic part according to an eighth aspect of the present invention, an electronic part according to any of the first to seventh aspects is accommodated in an insulated case with a part of the external terminal arranged so as to be connectable with an external object.

In the case of an electronic part with a case, accommodating an electronic part comprising an external terminal made of a metallic plate provided with a slit in an insulated case, generation of crack or split in the electronic part element can be prevented efficiently by alleviating the stress to be applied onto the electronic part element generated by the deflection of the mounted substrate or the difference between the external terminal and the electronic part element in terms of the coefficient of linear expansion when the thermal shock is applied as well as breakage or electric shock caused by stress from the outside, in particular, by any striking of the case can be prevented.

Moreover, in an electronic part according to a ninth aspect of the present invention, an electronic part according to any of the first to seventh aspects is accommodated in an insulated case with the insulated case filled with a resin with a part of the external terminal exposed.

In the case where an electronic part using an external terminal made of a metallic plate provided with a slit is accommodated in an insulated case and the insulated case is filled with a resin, an effect which is the same as the effect achieved in the case of the electronic part according to the eighth aspect as can be achieved as well. More particularly, since the electronic part element is embedded and maintained in the resin, the impact resistance, the vibration resistance, and the weathering resistance can further be improved. Moreover, the resin for filling the inside of the case can also serves as the substance for filling the slit.

Other features and advantages of the present invention will become apparent from the following description of the invention which refers to the accompanying drawings.

DESCRIPTION OF THE PREFERRED EMBODIMENTS

Hereinafter several embodiments of the present invention will be described in detail to explain the features of the present invention.

First Embodiment

Figure 1:
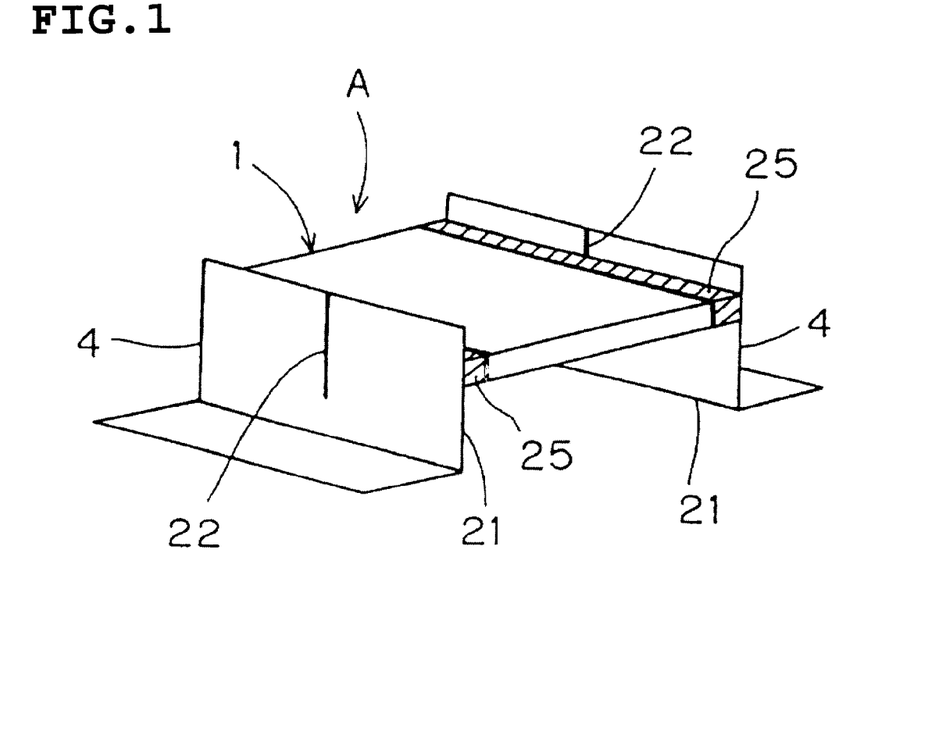
FIG. 1 is a perspective view showing an electronic part according to a first embodiment of the present invention.
Figure 2:
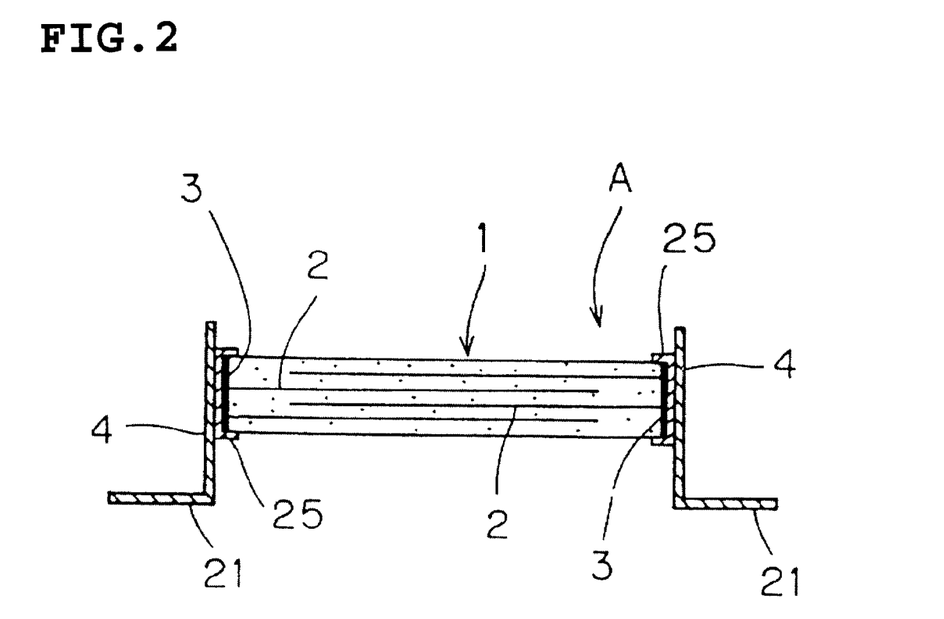
FIG. 2 is a cross-sectional view of the electronic part according to the first embodiment of the present invention.

FIG. 1 is a perspective view showing an electronic part according to an embodiment of the present invention, and FIG. 2 is a cross-sectional view thereof.

The electronic part A according to this embodiment comprises an electronic part element 1 (in this embodiment, a multi-layer ceramic capacitor element) with electrodes 25 for connection formed at both end faces thereof so as to conduct with internal electrodes 2 (FIG. 2), and metallic (herein oxygen free copper) external terminals 4 attached on both of the end faces of the electronic part element 1 via a conductive jointing material 3 (in this embodiment, solder).

In the electronic part A according to this embodiment, the external terminals 4 are formed by providing a slit 22 in a metallic plate 21 in the direction substantially perpendicular to the mounting surface of the electronic part A, and bending the lower part of the external terminals 4 outward into an L-shape. Although the case with the lower part of the external terminals 4 bent outward is explained in this embodiment as an example, it is also possible to bend the lower parts inward (to the electronic part element 1 side), or to provide the terminals 4 in a flat plate-like shape without bending.

The length of the slit 22, which is longer than the thickness of the electronic part element 1, extends from the lower side of the contacting part of the external terminal 4 and the electronic part element 1 to the upper end of the external terminal 4.

Furthermore, in this embodiment, the coating thickness of the solder, which is the conductive jointing material, on both end faces of the electronic part element 1 was 100 $\mu$m or less.

Moreover, in this embodiment, the width of the slit 22 was 1.0 mm.

These dimensions were set in consideration of the risk of lowering the strength of the external terminals 4, or increasing the ESR if the width of the slit 22 is too large. It is preferable to adjust the width of the slit 22 optionally in consideration of the size and the material of the electronic part element and the external terminals, the application of the electronic part, and the like.

As mentioned above, since the electronic part A of this embodiment uses external terminals 4 provided with a slit 22 in metallic plates 21 in the direction substantially perpendicular to the mounting surface of the electronic part A, with the length longer than the thickness of the electronic part element 1, generation of crack, split or peel-off in the electronic part element 1 can be prevented by absorbing or alleviating the stress to be applied onto the electronic part element 1 generated by the deflection of the mounted substrate on which the electronic part element is mounted or the difference between the external terminal 4 and the electronic part element 1 in terms of the coefficient of linear expansion owing to the existence of the slit 22 when the thermal shock is applied. The length of the slit 22 does not always need to be longer than the thickness of the electronic part 1, nor extend from the lower side of the contacting part of the external terminal 4 and the electronic part element 1 to the upper end of the external terminal 4. In that case, it also can achieve the stress absorbing effect, and thus it is worthwhile.

Moreover, since the slit 22 is formed in the direction substantially perpendicular to the mounting surface of the electronic part A in the above-mentioned embodiment, the stress to be applied on the electronic part 1 when the thermal shock is applied can be absorbed or alleviated while keeping the mechanical strength, and the like, necessary for the external terminal 4.

The electrodes 25 for connection provided in the above-mentioned embodiment do not always need to be formed, but can be omitted if the external terminals 4 and the internal electrode 2 can be connected directly. The same can be applied to the embodiments explained below.

Second Embodiment

Figure 3:
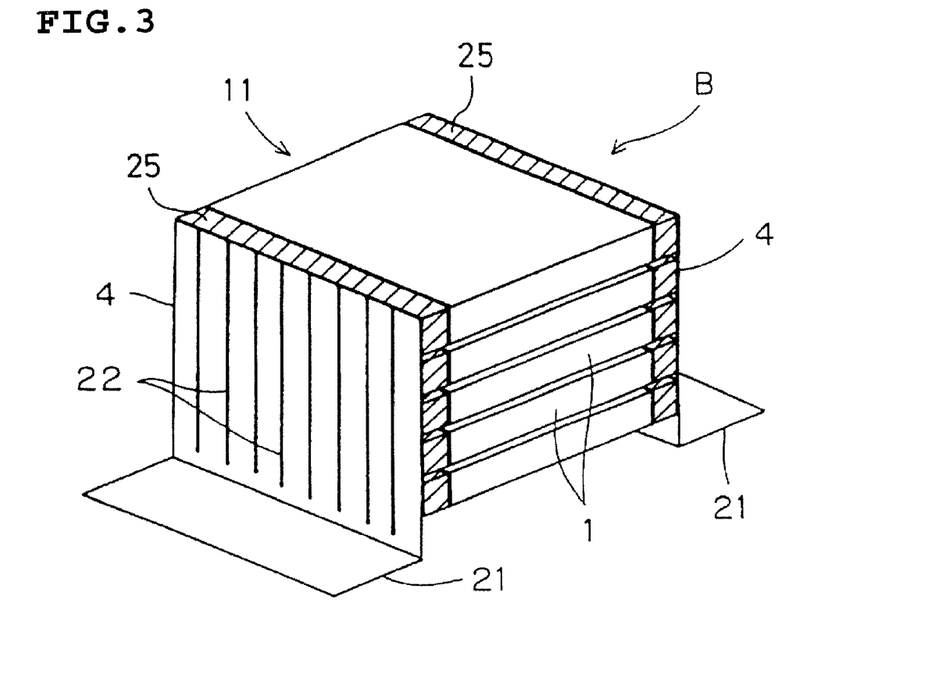
FIG. 3 is a perspective view showing an electronic part according to a second embodiment of the present invention.
Figure 4:
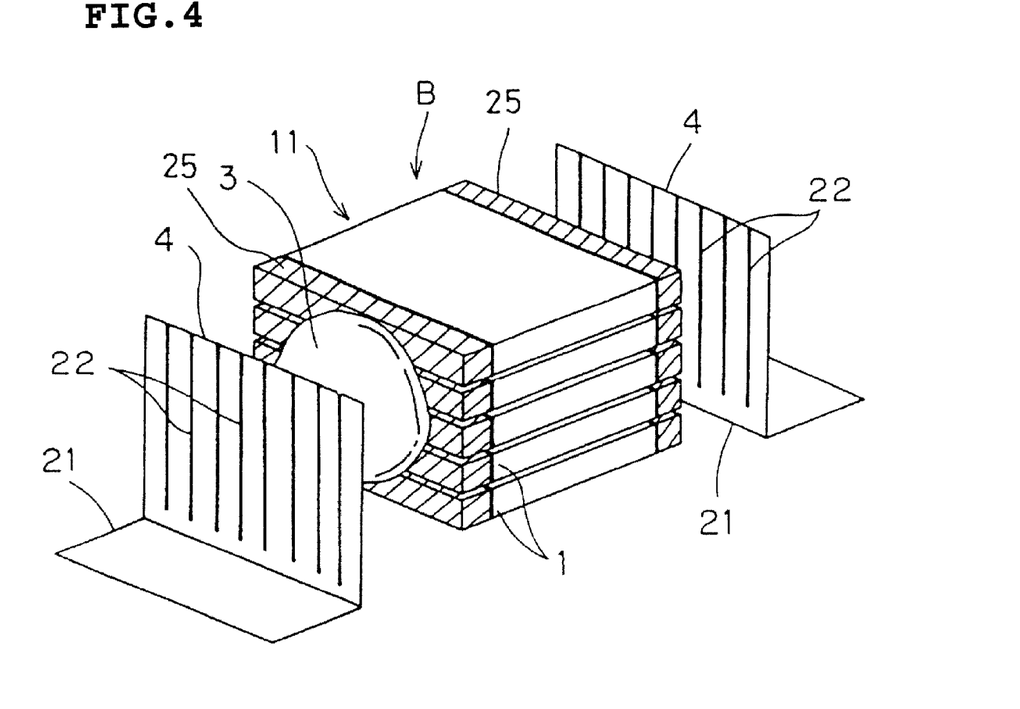
FIG. 4 is an exploded perspective view of the electronic part according to the second embodiment of the present invention.

FIG. 3 is a perspective view showing an electronic part according to a second embodiment of the present invention, and FIG. 4 is an exploded perspective view thereof.

The electronic part B according to this embodiment comprises a multi-layer member 11 formed by laminating a plurality (herein 5 pieces) of an electronic part element 1 (in this embodiment, a multi-layer ceramic capacitor element) with electrodes 25 for connection formed at both ends so as to conduct with an internal electrode 2, and metallic external terminals 4 attached on both end faces of the multi-layer member 11 via a conductive jointing material 3.

In the electronic part B according to this embodiment, the external terminals 4 are formed by providing a plurality of slits 22 (in this embodiment, 8 slits) in a metallic plate 21 in a direction substantially perpendicular to the mounting surface of the electronic part B, and bending the lower part of the external terminals 4 outward into an L-shape.

The slits 22 are provided so as to reach the upper end and the lower end of the contacting part of the external terminal 4 and the multi-layer member 11 but do not always need to reach such upper and lower ends.

Moreover, the length of the slits 22 does not always need to be thicker than the thickness of the element multi-layer member 11. If the length is shorter than the thickness of the multi-layer member 11, it can achieve the stress absorbing effect in its own way, and thus it is worthwhile. The same can be applied to the embodiments explained below.

In this embodiment, the width of the slits 22 was also 1.0 mm. Moreover, the coating thickness of the solder, which is the jointing material, on both end faces of the electronic part element 1 was 100 $\mu$m or less as in the case of the above-mentioned first embodiment.

Since the electronic part B of this embodiment uses external terminals 4 provided with slits 22 in metallic plates 21 in the direction substantially perpendicular to the mounting surface of the electronic part B as the external terminals 4, generation of crack, split or peel-off in the electronic part element 1 can be prevented so as to improve the reliability by absorbing or alleviating the stress to be applied onto the electronic part elements 1 generated by the deflection of the substrate on which the multi-layer member 11 is mounted or the difference between the external terminal 4 and the electronic part elements 1 of the multi-layer member 11 in terms of the coefficient of linear expansion owing to the existence of the slits 22 when the thermal shock is applied.

The relationship between the number of the slits in the external terminals and the crack generation ratio in the electronic part B of this embodiment was examined with the electronic part element 1 of a 40.0 mm×54.0 mm×5.0 mm size. The crack generation ratio was measured by checking the generation state of cracks after repeating 100 cycles of cooling and heating from −55° C. to +125° C.

As a result, without a slit formed in the external terminals, crack generation was observed by 100%, on the other hand, with one slit provided, the crack generation ratio was dropped to 5%, and with 2 to 8 slits, no crack generation was observed in the electronic part.

Third Embodiment

Figure 5:
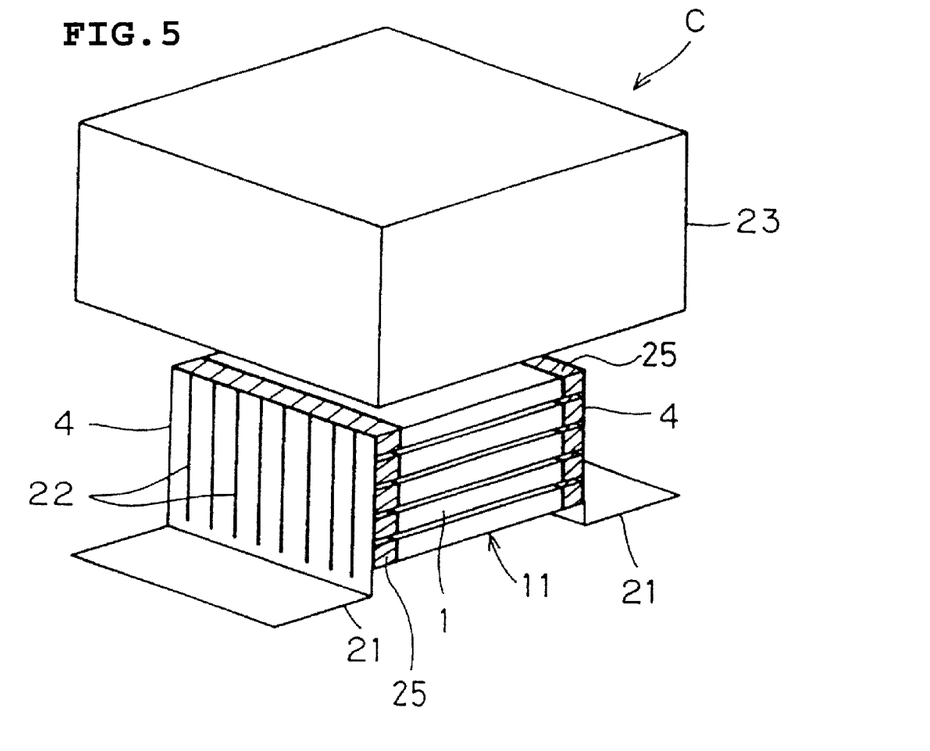
FIG. 5 is an exploded perspective view showing an electronic part according to a third embodiment of the present invention.
Figure 6:
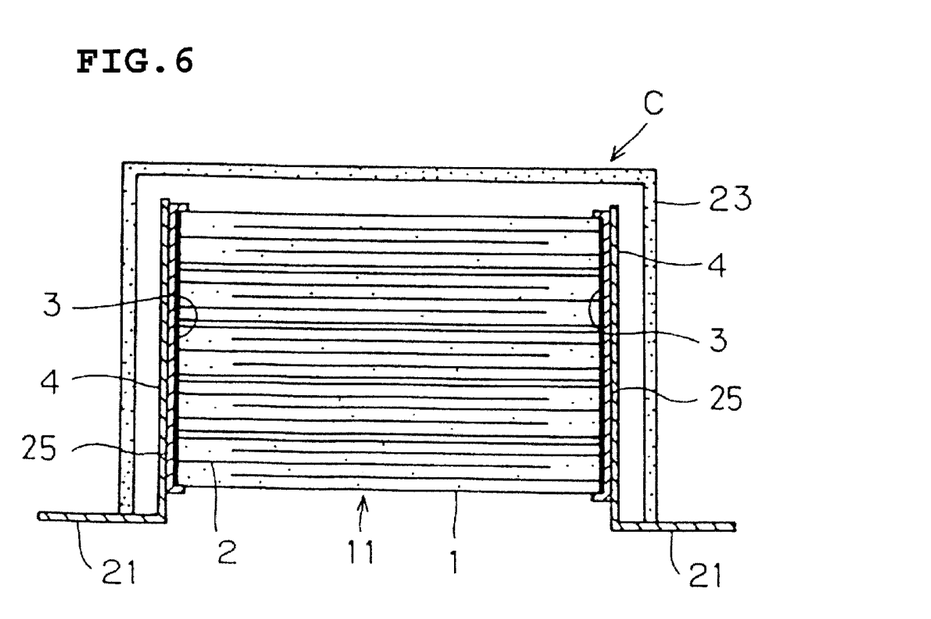
FIG. 6 is a cross-sectional view showing the electronic part according to the third embodiment of the present invention.

FIG. 5 is an exploded perspective view showing an electronic part according to a third embodiment of the present invention, and FIG. 6 is a cross-sectional view thereof.

The electronic part C according to this embodiment is formed by accommodating the electronic part B of the above-mentioned second embodiment, that is, the electronic part B comprising an element multi-layer member 11, and metallic external terminals 4 attached on both end faces of the element multi-layer member 11 via a conductive jointing material 3 (FIG. 4) in an insulated case 23 comprising an insulating material such as a resin, with the lower side opened.

According to the electronic part with a case C of this embodiment, generation of crack, split or peel-off in the electronic part elements 1 of the element multi-layer member 11 can be prevented efficiently by absorbing or alleviating the stress generated by the deflection of the mounted substrate or the difference between the external terminal 4 and the electronic part elements 1 of the element multi-layer member 11 in terms of the coefficient of linear expansion owing to the existence of the slits 22 when the thermal shock is applied as well as breakage or electric shock caused by the stress from the outside, in particular, by the clash can be prevented.

Fourth Embodiment

Figure 7:
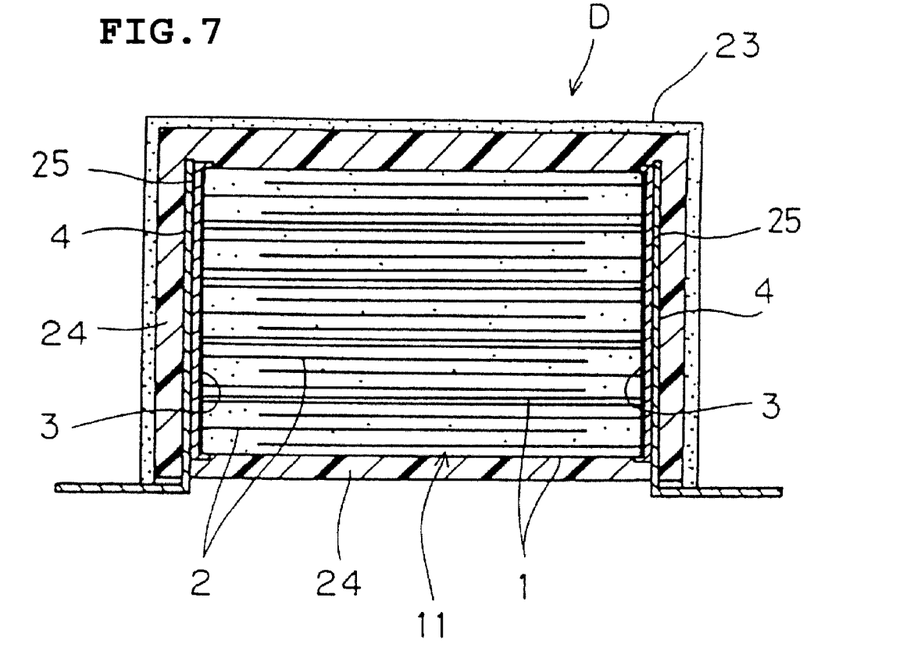
FIG. 7 is a cross-sectional view showing the electronic part according to a fourth embodiment of the present invention.

FIG. 7 is a cross-sectional view showing an electronic part according to a fourth embodiment of the present-invention.

The electronic part D of this embodiment is formed by filling the insulated case 23 of the electronic part C explained in the above-mentioned third embodiment with a resin 24 (in this embodiment, epoxy resin), and curing. As the resin, various kinds of other resins, such as a silicone resin and a phenol resin, can be used.

The electronic part D of this embodiment achieves the same effect as the electronic part C of the above-mentioned third embodiment. Furthermore, since the electronic part elements 1 of the multi-layer member 11 are embedded and maintained in the resin 24, the impact resistance, the vibration resistance, and the weathering resistance can further be improved.

Fifth Embodiment

Figure 8:
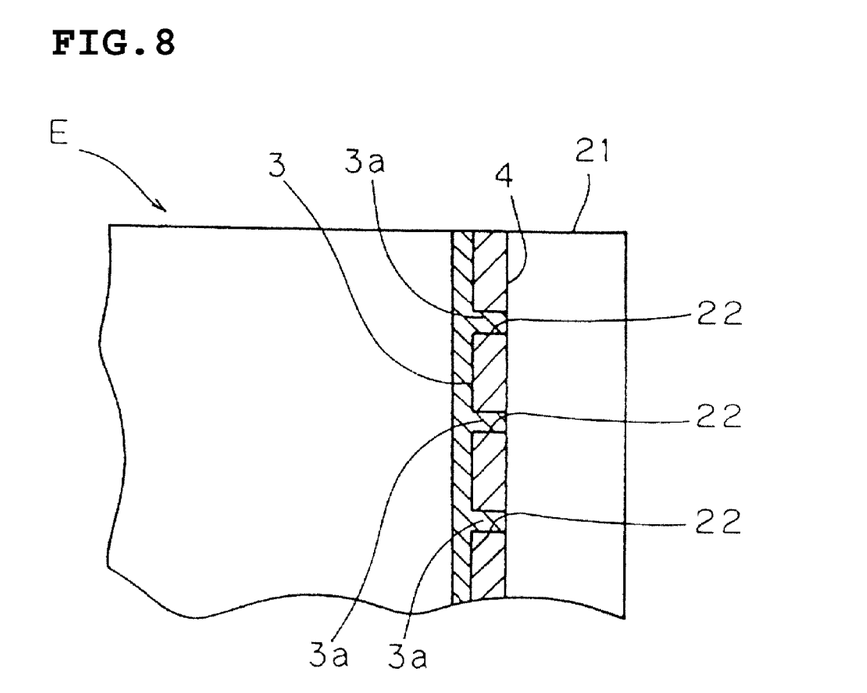
FIG. 8 is a plan cross-sectional view showing the main part of the electronic part according to a fifth embodiment of the present invention.

FIG. 8 is a plan cross-sectional view showing the main part of an electronic part E according to a fifth embodiment of the present invention. As shown in FIG. 8. In the electronic part of the fifth embodiment, the slits 22 formed in the external terminal 4 are filled with a jointing material 3 (filling substance 3a) for jointing the external terminal 4 with the electronic part element 1. The solder, which is the filling substance 3a, has a larger coefficient of linear expansion with respect to the coefficient of linear expansion of the external terminal made from oxygen free copper, and contracts more dramatically than the external terminal particularly at a low temperature. Moreover, since the solder has a lower Young's modulus with respect to the external terminal made from oxygen free copper, the stress to be applied onto the electronic part itself becomes smaller.

Since the slits 22 formed in the external terminal 4 are filled with a solder (filling substance) 3a, which is a substance having a larger coefficient of linear expansion and a lower Young's modulus with respect to the material comprising the external terminal 4 in the fifth embodiment, generation of crack, split or peel-off in the electronic part 1 can be prevented so as to improve the reliability by absorbing the stress to be applied onto the electronic part element 1 generated by the deflection of the mounted substrate or the difference between the external terminal 4 and the electronic part element 1 in terms of the coefficient of linear expansion owing to the existence of the slit 22 as well as by further reducing the stress to be applied onto the electronic part element 1 owing to the existence of the solder (filling substance) 3a for filling the slits 22 when the thermal shock is applied. Moreover, since the entirety of the end part of the electronic part is covered as a result of filling with the filling substance, the weathering resistance can also be improved. In this case, the filling substance for filling the slits 22 is not limited to the solder, but can be a conductive adhesive containing a conductive component in a resin, or a non-conductive resin.

The relationship between the number of the slits and the crack generation ratio was examined by thermal shock test of the below-mentioned specimens (multi-layer ceramic capacitor) prepared by filling a slit formed in an external terminal with various kinds of filling substances. The thermal shock test involved repeating for 100 cycles (the maintaining time of each temperature was 30 minutes) a cooling and heating cycle from −55° C. to +125° C. The results are shown in Table 1.

1. size of the electronic part element: 40.0 mm×54.0 mm×5.0 mm
2. thickness of the external terminal: 1 mm
3. slit width of the external terminal: 1 mm
4. number of slits: one, two, three, five, eight
5. kind of the filling substance: epoxy resin, phenol resin, solder For the specimens using an epoxy resin or a phenol resin as the filling substance, conductive adhesives containing them and a conductive substance were used as the jointing material. Moreover, for the specimen using a solder as the filling substance, the solder, which is the jointing material for jointing the external terminal with the electronic part element was used also as the filling substance.

TABLE 1

| | Crack generation ratio (%) Number of slits formed in the external terminals | | | | |
|---|---|---|---|---|---|
| Condition | one | two | three | five | eight |
| Only slit(s) is/are formed in the external terminals without being filled with a filling substance. | 5 | 0 | 0 | 0 | 0 |
| The slit(s) of the external terminals is/are filled with an epoxy resin. | 0 | 0 | 0 | 0 | 0 |
| The slit(s) of the external terminals is/are filled with a phenol resin. | 1 | 0 | 0 | 0 | 0 |
| The slit(s) of the external terminals is/are filled with a solder. | 3 | 0 | 0 | 0 | 0 |

As shown in Table 1, in the case where the slit formed in the external terminal is not filled with a filling substance, and with one slit provided, cracks were generated in 5% of the specimens. With respect to the specimens filled with the filling substance, cracks were generated only by 1% when they were filled with a phenol resin, and only by 3% when they were filled with a solder. When they were filled with an epoxy resin, no crack generation was observed. Moreover, in the other conditions, crack generation was not observed.

As mentioned above, by filling the slits formed in the external terminal with a filling substance, the stress to be applied onto the electronic part element can further be reduced compared with the case where only the slits are provided to improve the reliability. This can be explained on the basis that since the substance for filling the slit expands and contracts more dramatically than the external terminal, in particular, the filling substance contracts more dramatically than the external terminal at a low temperature, the deformation (expansion, contraction) of the external terminal is restrained; that is, expansion and contraction of the external terminal itself are restrained owing to the influence from the expansion and the contraction of the filled substance, and consequently the stress to be applied onto the electronic part element is reduced. Moreover, in the case where a substance having a lower Young's modulus with respect to the external terminal is provided for filling, the stress on the electronic part itself becomes smaller. In the electronic part according to this embodiment, it is preferable that the filing material is accommodated in the slit, but even if it overflows the slit slightly, it does not have a great influence on the effect of restraining the stress to be applied onto the electronic part element.

Although the above-mentioned embodiments have been explained with respect to embodiments using a multi-layer ceramic capacitor element as the electronic part element as examples, the kinds of the electronic part elements are not limited thereto in the present invention, but the present invention can be adopted to various kinds of electronic part elements such as varistors and inductors. Moreover, it can be adopted in electronic parts other than ceramic electronic parts.

Moreover, although the cases of using a solder as the conductive jointing material have been explained in the above-mentioned embodiments, the jointing material is not limited thereto but various materials such as a conductive adhesive containing a conductive component and an organic adhesive can be used.

The present invention is not limited to the above-mentioned embodiments also in other aspects, but can be applied or modified in various ways in terms of the kind of the metal comprising the external terminals, the shape of the external terminals, the number and the size of slits to be formed in the external terminals, the material and the shape of the insulated case, and the kind of the resin to be filled into the insulated case, within the range of the gist of the invention.

Accordingly, although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electronic part comprising:

an electronic part element, and at least one external terminal made of a metallic plate provided with a slit attached to the electronic part element via a respective conductive joint member, wherein the slit of the at least one external terminal is formed only in a direction substantially perpendicular to a mounting surface of the electronic part and the slit is filled with a substance having a larger coefficient of linear expansion or a substance having a lower Young's modulus with respect to the material comprising the at least one external terminal.

2. The electronic part according to claim 1, wherein a plurality of slits are provided in the metallic plate comprising the at least one external terminal, each of which is formed only in a direction substantially perpendicular to a mounting surface of the electronic part and each of the slits is filled with a substance having a larger coefficient of linear expansion or a substance having a lower Young's modulus with respect to the material comprising the at least one external terminal.

3. The electronic part according to claim 2, wherein the substance for filling the slits is at least one selected from the group consisting of a resin, a solder and a conductive adhesive.

4. The electronic part according to claim 2, wherein the substance for filling the slits is made of the same substance as the respective conductive jointing member.

5. The electronic part according to claim 1, wherein the substance for filling the slit is at least one selected from the group consisting of a resin, a solder and a conductive adhesive.

6. The electronic part according to claim 1, wherein the substance for filling the slit is made of the same substance as the respective conductive jointing material.

7. The electronic part according to claim 1, including a second external terminal made of a metallic plate provided with a slit, the at least one external terminal being attached to one side of said electronic part element via the respective conductive joint members and the second external terminal being attached to an opposite side of said electronic part element via another conductive joint member.

8. An electronic component which comprises an insulated case and an electronic part according to claims 7, wherein the insulated case is filled with a resin with respective parts of the at least one and second external terminals of the electronic part exposed so as to be connectable to an external object.

9. The electronic component according to claim 8, wherein a plurality of slits are provided in the metallic plates comprising the at least one and second external terminals.

10. The electronic component according to claim 9, wherein the respective slits of the at least one and second external terminals are formed in a direction substantially perpendicular to the mounting surface of the electronic part.

11. The electronic component according to claim 10, wherein the slits are filled with a substance having a larger coefficient of linear expansion or a substance having a lower Young's modulus with respect to the material comprising the external terminal.

12. The electronic component according to claim 11, wherein the substance for filling the slits is at least one selected from the group consisting of a resin, a solder and a conductive adhesive.

13. The electronic component according to claim 11, wherein the substance for filling the slits is made of the same substance as the respective and another conductive jointing members used for attaching the at least one and second external terminals with the electronic part element.

* * * * *